(12) United States Patent
Nardi et al.

(10) Patent No.: US 9,054,634 B1
(45) Date of Patent: Jun. 9, 2015

(54) VOLTAGE CONTROLLING ASSEMBLIES INCLUDING VARIABLE RESISTANCE DEVICES

(71) Applicant: Intermolecular Inc., San Jose, CA (US)

(72) Inventors: Federico Nardi, Palo Alto, CA (US); Yun Wang, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/140,821

(22) Filed: Dec. 26, 2013

(51) Int. Cl.
    H03K 3/26 (2006.01)
    H03B 7/06 (2006.01)
    H03K 3/0231 (2006.01)
    G11C 11/16 (2006.01)

(52) U.S. Cl.
    CPC ........ H03B 7/06 (2013.01); G11C 11/16 (2013.01); H03K 3/0231 (2013.01)

(58) Field of Classification Search
    CPC .......... H03K 3/0231; H03K 3/354; H03K 3/356008; H03K 3/356113; H03K 4/501; H03K 5/2481; H03K 17/166; H03K 17/167; H03K 19/16; H03K 19/177; H03K 19/17724; G11C 11/16; G01R 31/3025; G01R 31/308; G01R 31/318555; G01R 31/318572; G08C 17/02; H03J 2200/10; G01L 1/20; G01L 1/205; G05F 1/468; G05F 1/563; G05F 1/614
    USPC ............... 331/115, 111, 143; 706/26; 257/4; 977/943; 365/148, 158; 327/540
    See application file for complete search history.

(56) References Cited

U.S. PATENT DOCUMENTS

| 8,780,609 | B2 * | 7/2014 | Mori et al. ............ 365/148 |
| 2003/0151450 | A1 * | 8/2003 | Nguyen et al. ........ 327/540 |

OTHER PUBLICATIONS

Catanzaro et al.; Reconfigurable RRAM for LUT Logic Mapping a Case Study for Reliability Enhancement; Jan. 1, 2012; IEEE.
C. Dong et al.; Efficient logic architectures for CMOL nanoelectronic circuits; Apr. 18, 2006; The Institute of Engineering and Technology.
Strukov; Analog CMOSMemristor Hybrid Circuits; Sep. 1, 2011; UC Santa Barbara; Nano and Giga Challenges in Electronics, Photonics and Renewable Energy Moscow, Russia Sep. 1, 2011.

* cited by examiner

*Primary Examiner* — Arnold Kinkead

(57) ABSTRACT

Provided are voltage controlling assemblies that may be operable as clocks and/or oscillators. A voltage controlling assembly may include a comparator and a variable resistance device connected to one differential signal node of the comparator. The other node may be connected to a capacitor. Alternatively, no capacitors may be used in the assembly. During operation of the voltage controlling assembly, the variable resistance device changes its resistance between two different resistive states. The change from a low to a high resistive state may be associated with a voltage spike at the differential signal node of the comparator and trigger a response from the comparator. This resistance change may have a delay determining an operating frequency of the voltage controlling assembly. Specifically, the variable resistance device in the low resistive state may be kept for a period of time at a certain voltage before it switches into the high resistive state.

20 Claims, 11 Drawing Sheets

VOLTAGE CONTROLLING ASSEMBLIES INCLUDING VARIABLE RESISTANCE DEVICES

TECHNICAL FIELD

The present invention relates generally to voltage controlling assemblies, such as oscillators, and more specifically to voltage controlling assemblies including variable resistance devices.

BACKGROUND

An electronic oscillator is an electronic circuit that produces a repetitive oscillating electronic signal, such as a sine wave or a square wave. Oscillators may be used to convert a direct current (DC) from a DC power supply to an alternating current (AC). They are widely used in many electronic devices. Some examples of signals generated by oscillators include signals broadcast by radio and television transmitters, clock signals that regulate computers and quartz clocks, and the sounds produced by electronic beepers and video games.

SUMMARY

Provided are voltage controlling assemblies that may be operable as clocks and/or oscillators. A voltage controlling assembly may include a comparator and a variable resistance device connected to one differential signal node of the comparator. The other node of the comparator may be connected to a capacitor. Alternatively, no capacitors may be used in the assembly. During operation of the voltage controlling assembly, the variable resistance device or, more specifically, a variable resistance layer of the variable resistance device changes its resistance between two different resistive states. The change from a low to a high resistive state may be associated with a voltage spike at the differential signal node of the comparator and trigger a response from the comparator. This resistance change may have a delay determining an operating frequency of the voltage controlling assembly. Specifically, the variable resistance layer in the low resistive state may be kept for a period of time at a certain voltage before it switches into the high resistive state.

In some embodiments, a voltage controlling assembly includes a comparator having a first differential signal node and a second differential signal node. The voltage controlling assembly includes a variable resistance device including a first conductive layer, a second conductive layer, and a variable resistance layer. The first conductive layer is operable as a first electrode of the variable resistance device and is electrically connected to the first differential signal node of the comparator. The second conductive layer is operable as a second electrode of the variable resistance device and is electrically connected to a reference voltage source. The variable resistance layer is disposed between the first conductive layer and the second conductive layer and is configured to switch between a first resistive state and a second resistive state. The resistance of the variable resistance layer in the first resistive state is less than a resistance of the variable resistance layer in the second resistive state.

In some embodiments, the variable resistance device is a bipolar variable resistance device. Specifically, the variable resistance device may be configured to switch from the first resistive state to the second resistive state when a potential of the first conductive layer is greater than a potential of the second conductive layer.

In some embodiments, the frequency output of the voltage controlling assembly is determined by a delay in switching from the first resistive state to the second resistive state when a switching voltage is applied by the comparator between the first conductive layer and the second conductive layer. This applied voltage may be changed to change the frequency output.

The voltage controlling assembly may also include a first constant resistor and a second constant resistor connected to the second differential signal node of the comparator. The voltage controlling assembly may also include a third constant resistor connected to the first differential signal node of the comparator. Alternatively, the voltage controlling assembly may include an additional variable resistance device connected to the first differential signal node of the comparator. In some embodiments, the voltage controlling assembly includes a capacitor connected to the second differential signal node of the comparator. In some embodiments, the voltage controlling assembly also includes an additional variable resistance device connected to the first differential signal node of the comparator.

In some embodiments, the voltage controlling assembly may include an additional variable resistance device connected to the first differential signal node of the comparator. The voltage controlling assembly may also include additional variable resistance devices connected to the second differential signal node of the comparator.

In some embodiments, the variable resistance layer comprises one of a phase change chalcogenide, a transition metal oxide, a perovskite, a solid electrolyte, an organic charge transfer complex, or an organic donor-acceptor system. More specifically, the variable resistance layer may include a transition metal oxide or even a non-stoichiometric transition metal oxide. Some examples of materials that may be used for the variable resistance layer include hafnium oxide, zirconium oxide, aluminum oxide, titanium oxide, tantalum oxide, and silicon oxide. In some embodiments, the variable resistance layer includes a phase change chalcogenide.

In some embodiments, the voltage controlling assembly is operable as a clock having voltage spikes at a constant frequency. Alternatively, the voltage controlling assembly may be operable as an oscillator. The oscillator may be configured to produce different durations dependent on whether the voltage output is negative or positive. The reference voltage source, to which the second conductive layer of the variable resistance device is connected, may be ground.

These and other embodiments are described further below with reference to the figures.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings, in which.

DETAILED DESCRIPTION OF EXAMPLE EMBODIMENTS

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Oscillators are often designed to have controlled oscillation frequencies. For example, the oscillation frequency may be varied over some range by an input voltage or an input current. The voltage controlled oscillators are widely used in phase-locked loops, in which the oscillator's frequency may be locked to the frequency of another oscillator. Such oscillators have a pervasive use in modern communications circuits, such as filters, modulators, and demodulators. They also form the basis of frequency synthesizer circuits, which are used to tune radios and televisions. One type of voltage controlled oscillator is a relaxation oscillator, which typically has its oscillation frequency determined by the time it takes to charge and/or discharge its capacitor to some threshold level. The frequency range of this oscillator is limited by the charge and discharge characteristics of its capacitor.

Described herein are voltage controlling assemblies that may be operable as clocks and/or oscillators or, more specifically, as voltage controlled oscillators. A voltage controlling assembly may include a comparator and a variable resistance device connected to one of the two differential signal nodes of the comparator. The variable resistance device or, more specifically, a variable resistance layer of the variable resistance device is configured to change its resistance between two different resistive states. The change from a low to a high resistive state may be associated with a voltage spike at the differential signal node of the comparator and may be used to trigger a response from the comparator, such as a reversal of the polarity on the differential signal nodes of the comparator. As such, the voltage controlling assembly is not limited by the discharge characteristics of a capacitor, even though a capacitor may be present in some embodiments of the voltage controlling assembly as further described below. In some embodiments, the voltage controlling assembly does not have a capacitor. The resistive switching time of the variable resistance layer may be on the order of pico-seconds, and thereby may have no detectable impact on the oscillation frequency.

Figure 1A:
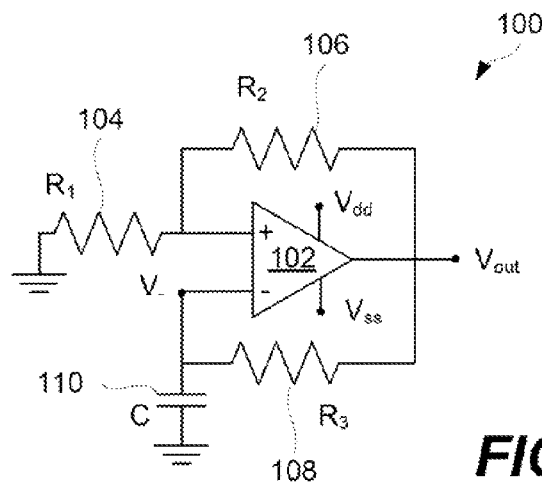
FIG. 1A is an electrical diagram of an example of a capacitor-controlled relaxation oscillator), in accordance with some embodiments.

A brief description of a relaxation oscillator using a capacitor to control its frequency is first presented to provide some context of various features of new voltage controlling assemblies. Specifically, FIG. 1A is an electrical diagram of a capacitor-controlled relaxation oscillator 100, in accordance with some embodiments. Relaxation oscillator 100 includes a comparator 102 having two differential signal nodes, which are identified as (+) and (−) in the figure. Comparator 102 is connected to a DC power supply through nodes $V_{dd}$ and $V_{ss}$. Comparator 102 also has an output node $V_{out}$. Relaxation oscillator 100 also includes three resistors 104, 106, and 108 and a capacitor 110.

The basic operating principle of relaxation oscillator 100 can be explained as follows. Relaxation oscillator 100 stores energy in capacitor 110 and then dissipates that energy repeatedly to set up the oscillations. For example, capacitor 110 can be charged using a power from one node of comparator 102 until it reaches a threshold voltage. At that instant, capacitor 110 can be quickly discharged. After each discharge of capacitor 110, comparator 102 may reverse the polarity of the power used for the next charge or, more specifically, change the connections between its differential signal nodes (labeled as (+) and (−)) and its supply nodes (labeled as $V_{dd}$ and $V_{ss}$). In such a relaxation oscillator 100, the period of the oscillation is set by the dissipation rate of capacitor 110.

Figure 1B:
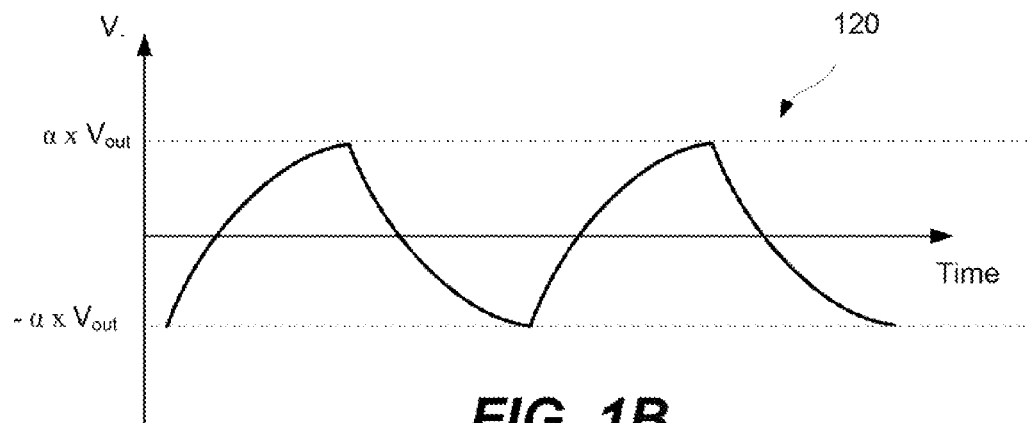
FIG. 1B illustrates a voltage profile at one of the differential signal nodes of the comparator of the relaxation oscillator (shown in FIG. 1A) as a function of time, in accordance with some embodiments.
Figure 1C:
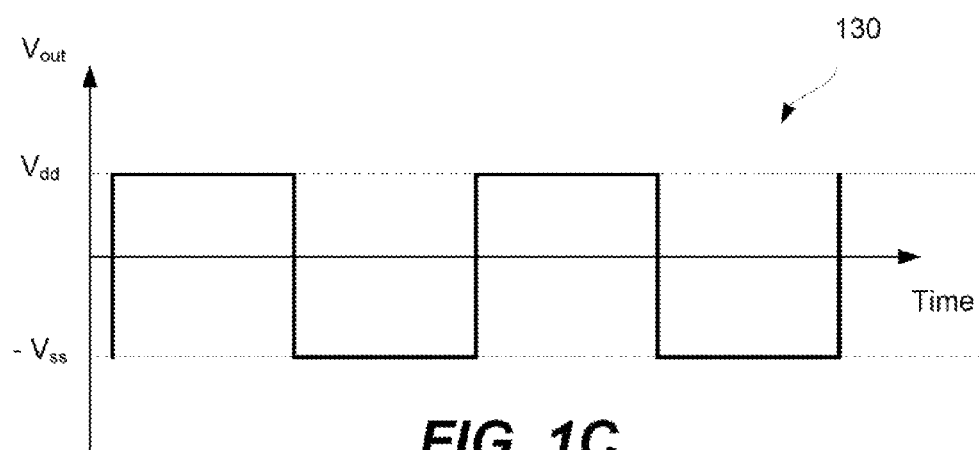
FIG. 1C illustrates a voltage profile at an output of the relaxation oscillator (shown in FIG. 1A) as a function of time and corresponding to the voltage profile at one of differential signal nodes (shown in FIG. 1B), in accordance with some embodiments.

One differential signal node (labeled with "+") is connected to the output through resistor 106 ($R_2$). Likewise, the differential signal node labeled with "−" is connected to the output through resistor 108 ($R_3$). Because of this, the inverting input of comparator 102 asymptotically approaches the comparator's output voltage ($V_{out}$) with a time constant. At the point where the voltage at the inverting input is greater than at the non-inverting input, the output of the comparator falls quickly due to positive feedback. This is due to the non-inverting input being less than the inverting input. As the output continues to decrease, the difference between the inputs gets more and more negative. Again, the inverting input approaches the comparator's output voltage asymptotically, and the cycle repeats itself once the non-inverting input is greater than the inverting input, hence the system oscillates. FIG. 1B illustrates a voltage profile 120 at the differential signal node connected to the capacitor (i.e., $V_-$ node) as a function of time. The capacitor charges and discharges between $\alpha \times V_{out}$ and $-\alpha \times V_{out}$, where the coefficient $\alpha$ is determined by the resistance ($R_3$) of resistor 108 and characteristics of capacitor 110. FIG. 1C illustrates a corresponding voltage profile 130 at output (i.e., $V_{out}$ node) as a function of time.

Figure 2A:
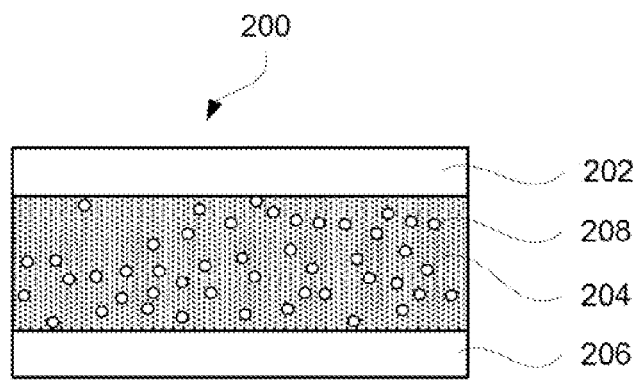
FIG. 2A is schematic representation of a variable resistance device including a first electrode, a second electrode, and a variable resistance layer disposed between the first electrode and the second electrode prior to initial formation of the variable resistance device, in accordance with some embodiments.

In some embodiments, a voltage controlling assembly may use the switching of a variable resistance device between low and high resistance states, rather than the charging and discharging of a capacitor, to determine its oscillation frequency. Prior to describing various aspects of voltage controlling assemblies, which are presented below with reference to FIG. 4A and FIGS. 5A-5D, a brief description of variable resistance devices is provided. Specifically, FIG. 2A illustrates a schematic representation of variable resistance device 200 including first electrode 202, second electrode 206, and variable resistance layer 204 disposed in between first electrode 202 and second electrode 206, in accordance with some embodiments. First electrode 202 and second electrode 206 may be formed from conductive materials, such as n-doped polysilicon, p-doped polysilicon, titanium nitride, ruthenium, iridium, platinum, and tantalum nitride. The electrodes may have a thickness of less than about 1,000 Angstroms, such as less than about 500 Angstroms and even less than about 100 Angstroms. Thinner electrodes may be formed using ALD techniques.

It should be noted that the "first" and "second" references for electrodes 202 and 206 are used solely for differentiation and not to imply any processing order or particular spatial orientation of these electrodes. Variable resistance device 200 may also include other components, such as an embedded resistor, diode, diffusion barrier layer, and other components.

Variable resistance layer 204 may be initially formed from a dielectric material and later made to conduct through one or more conductive paths formed within the layer by applying first a forming voltage and then a switching voltage. To provide this resistive switching functionality, variable resistance layer 204 includes a concentration of electrically active defects 208, which may be at least partially provided into the layer during its fabrication. For example, some atoms may be absent from their native structures (i.e., creating vacancies) and/or additional atoms may be inserted into the native structures (i.e., creating interstitial defects). Charge carriers may be also introduced as dopants, stressing lattices, and other techniques. Regardless of the types all charge carriers are referred to as defects 208.

The variable resistance layer can be fabricated from a dielectric material, such as a metal oxide material or other similar material that can be switched between two or more stable resistive states. In some embodiments, the variable resistance layer is fabricated from a high bandgap material, e.g., a material that has a bandgap of at least about 4 electron Volts. Some examples of such materials include hafnium oxide ($Hf_xO_y$), tantalum oxide ($Ta_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$) and zirconium oxide ($Zr_xO_y$). The high bandgap materials may improve data retention and reduce the current leakage since the amount of trapped charge in these materials is less than a lower bandgap material. Furthermore, the high bandgap materials create a large barrier height that the carriers have to cross during the read, set, and reset operations. Other suitable materials for variable resistance layer 306 include titanium oxide ($TiO_x$), nickel oxide ($NiO$)$_x$ and cerium oxide ($CeO_x$). Furthermore, semi-conductive metal oxide (p-type or n-type), such as zinc oxides ($Zn_xO_y$), copper oxides ($Cu_xO_y$), and their nonstoichiometric and doped variants can be used for the variable resistance layer.

In some embodiments, the variable resistance layer includes a dopant that has an affinity for oxygen, such as various transition metals (e.g., aluminum, titanium, and zirconium), to form a metal-rich variable resistance layer, such as a non-stoichiometric oxide (e.g., $HfO_{1.5}$-$HfO_{1.9}$ or, more specifically, $HfO_{1.7}$). The dopant may be the same materials as a metal of the base oxide (e.g., $HfO_2$ doped with hafnium) or different (e.g., $HfO_2$ doped with aluminum, titanium, and zirconium). Oxygen deficiency of the metal-rich variable resistance layer corresponds to a number of oxygen vacancies, which are believed to be defects responsible for resistive switching. The amount of defects is controlled to achieve certain switching and forming voltages, operating currents, improve performance consistency and data retention.

The variable resistance layer may have a thickness of between about 10 Angstroms to about 1000 Angstroms, such as between about 20 Angstroms and 200 Angstroms or, more specifically, between about 50 Angstroms and 100 Angstroms. Thinner variable resistance layers may be deposited using ALD, while thicker variable resistance layers may be deposited using may be deposited using ALD as well as physical vapor deposition (PVD) and, in some embodiments, chemical vapor deposition (CVD).

FIG. 2A is a schematic representation of variable resistance device 200 prior to initial formation of conductive paths, in accordance with some embodiments. Variable resistance layer 204 may include some defects 208. Additional defects 208 may be provided within first electrode 202 and may be later transferred to variable resistance layer 204 during the formation operation. In some embodiments, the variable resistance layer 204 has substantially no defects prior to forming operation and all defects are provided from first electrode 202 during forming. Second electrode 206 may or may not have any defects. It should be noted that regardless of presence or absence of defects in second electrode 206, substantially no defects are exchanged between second electrode 206 and variable resistance layer 204 during forming and/or switching operations.

Figure 2B:
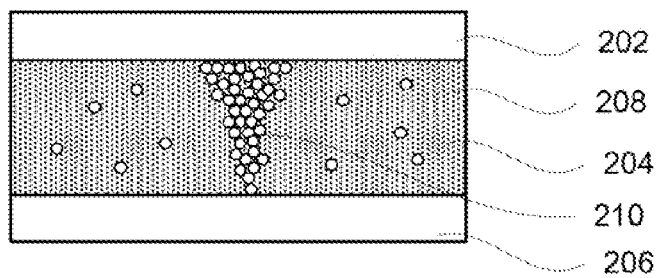
FIG. 2B is schematic representation of the variable resistance device (also shown in FIG. 2A) in its low resistive state (LRS), in accordance with some embodiments.

During the forming operation, variable resistance device 200 changes its structure from the one shown in FIG. 2A to the one shown in FIG. 2B. This change corresponds to defects 208 being arranged into one or more continuous paths within variable resistance layer 204 as, for example, schematically illustrated in FIG. 2B. Without being restricted to any particular theory, it is believed that defects 208 can be reoriented within variable resistance layer 204 to form these conductive paths as, for example, schematically shown in FIG. 2B. Furthermore, some or all defects 208 forming the conductive paths may enter variable resistance layer 204 from first electrode 202. For simplicity, all these phenomena are collectively referred to as reorientation of defects within variable resistance device 200. This reorientation of defects 208 occurs when a certain forming voltage is applied to electrodes 202 and 206. In some embodiments, the forming operation also conducted at elevated temperatures to enhanced mobility of the defects within variable resistance device 200. In general, the forming operation is considered to be a part of the fabrication of variable resistance device 200, while subsequent resistive switching is considered to be a part of operation of variable resistance device 200.

Figure 2C:
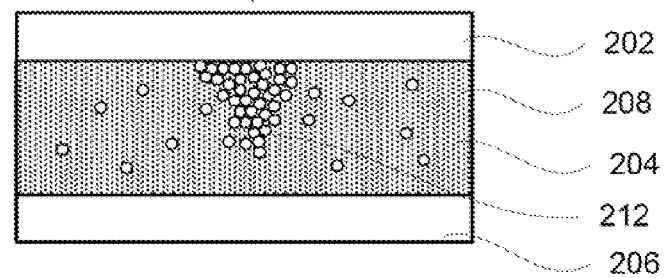
FIG. 2C is schematic representation of the variable resistance device (also shown in FIGS. 2A and 2B) in its high resistive state (HRS), in accordance with some embodiments.

Resistive switching involves breaking and reforming conductive paths through variable resistance layer 204, i.e., switching between the state schematically illustrated in FIG. 2B and the state schematically illustrated in FIG. 2C. The resistive switching is performed by applying switching voltages to electrodes 202 and 206. Depending on the magnitude and polarity of these voltages, conductive path 210 may be broken or formed back again. Specifically, FIG. 2C illustrates broken conductive path 212, while FIG. 2B illustrates complete conductive path 210. These voltages may be substantially lower than forming voltages (i.e., voltages used in the forming operation) since much less mobility of defects is needed during switching operations. For example, hafnium oxide based resistive layers may need about 7 Volts during their forming but can be switched using voltages less than 4 Volts. Without being restricted to any particular theory, it is believed that only a small portion of conductive path 210 dissipates during transition to broken conductive path 212 and then only this small portion needs to be rebuilt.

The state of variable resistance layer 204 illustrated in FIG. 2B is referred to as a low resistance state (LRS), while the state illustrated in FIG. 2C is referred to as a high resistance state (HRS). The resistance difference between the LRS and HRS is due to the different number and/or conductivity of conductive paths that exists in these states, i.e., conductive paths in variable resistance layer 204 are greater in number, density, length, continuity, thickness or conductivity when the layer is in the LRS than when it is in the HRS. It should be noted that variable resistance layer 204 may still have some conductive paths while it is in the HRS, but these conductive paths are fewer and/or more resistive than the ones corresponding to the LRS.

When switching from its LRS to HRS, which is often referred to as a reset operation, variable resistance layer 204 may release some defects into first electrode 202. Furthermore, there may be some mobility of defects within variable resistance layer 204. This may lead to thinning and, in some embodiments, breakages of conductive paths as shown in FIG. 2C. Depending on defect mobility within variable resistance layer 204 and diffusion through the interface formed by variable resistance layer 204 and first electrode 202, the conductive paths may break closer to the interface with second electrode 206, somewhere within variable resistance layer 204, or at the interface with first electrode 202. This breakage may not correspond to complete dispersion of defects forming these conductive paths and may be a self-limiting process, i.e., the process may stop after some initial breakage occurs.

When switching from its HRS to LRS, which is often referred to as a set operation, variable resistance layer 204 may receive some defects from first electrode 202. Similar to the reset operation described above, there may be some mobility of defects within variable resistance layer 204. This may lead to thickening and, in some embodiments, reforming of conductive paths as shown in FIG. 2B. In some embodiments, a voltage applied to electrodes 202 and 206 during the set operation has the same polarity as a voltage applied during the reset operation. This type of switching is referred to as unipolar switching. Alternatively, a voltage applied to electrodes 202 and 206 during the set operation may have different polarity than a voltage applied during the reset operation. This type of switching is referred to as bipolar switching. Setting and resetting operations may be repeated multiple times as will now be described with reference to FIGS. 3A and 3B.

Figure 3A:
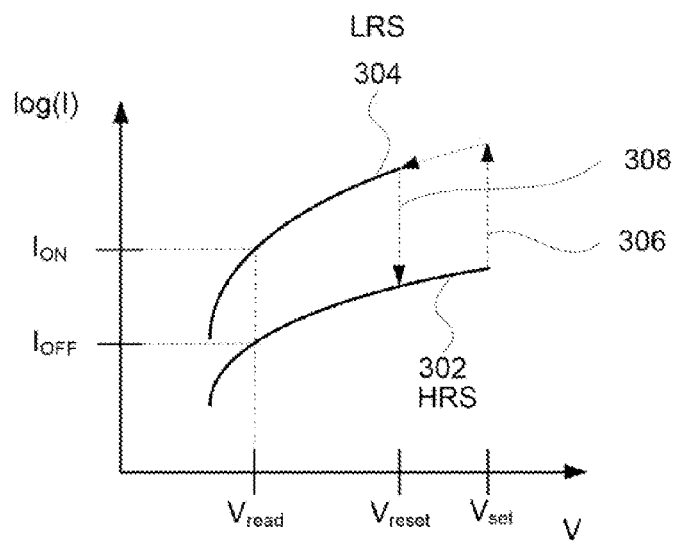
FIG. 3A illustrates a plot of a current passing through a unipolar variable resistance device as a function of a voltage applied to the variable resistance device, in accordance with some embodiments.
Figure 3B:
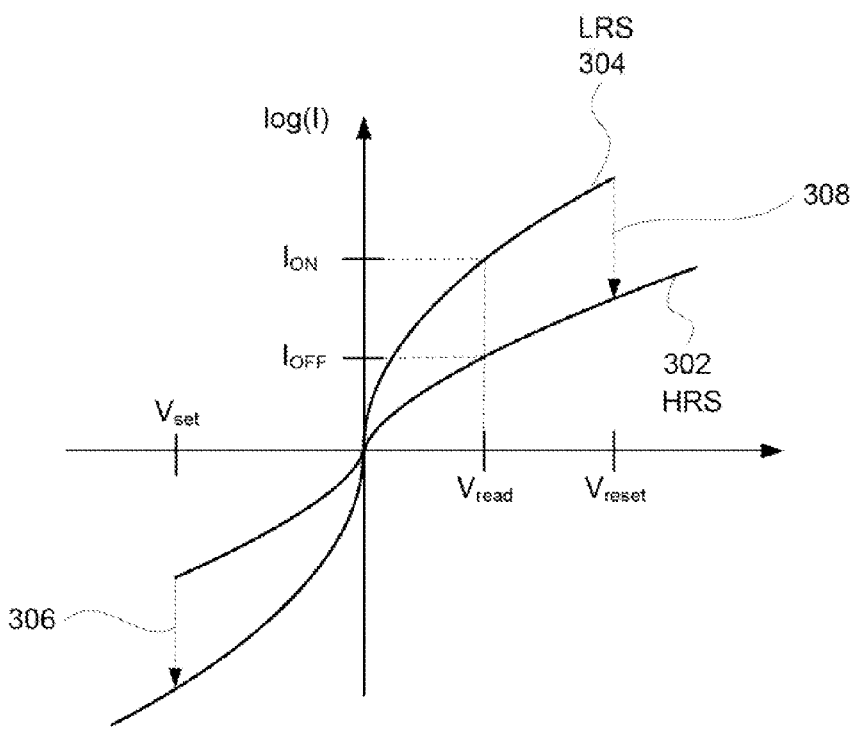
FIG. 3B illustrates the same type of a plot for a bipolar variable resistance device, in accordance with some embodiments.

Specifically, FIG. 3A illustrates a plot of a current passing through a unipolar variable resistance device as a function of a voltage applied to the variable resistance device, in accordance with some embodiments. FIG. 3B illustrates a similar plot for a bipolar variable resistance device, in accordance with some embodiments. The HRS is defined by line 302, while the LRS is defined by 304 in both plots. Each of these states is used to represent a different logic state, e.g., the HRS may represent logic one ("1") and LRS representing logic zero ("0") or vice versa. Therefore, each variable resistance device that has two resistance states may be used to store one bit of data. It should be noted that some variable resistance devices may have three and even more resistance states allowing multi-bit storage in the same cell.

The overall operation of the variable resistance device may be divided into a read operation, set operation (i.e., turning the cell "ON" by changing from its HRS to LRS), and reset operation (i.e., turning the cell "OFF" by changing from its LRS to HRS). During the read operation, the state of the variable resistance device or, more specifically, the resistive state of its resistance of variable resistance layer can be sensed by applying a sensing voltage to its electrodes. The sensing voltage is sometimes referred to as a "READ" voltage or simply a reading voltage and indicated as $V_{READ}$ in FIGS. 3A and 3B. If the variable resistance device is in its HRS (represented by line 302 in FIGS. 3A and 2B), the external read and write circuitry connected to the electrodes will sense the resulting "OFF" current ($I_{OFF}$) that flows through the variable resistance device. As stated above, this read operation may be performed multiple times without changing the resistive state (i.e., switching the cell between its HRS and LRS). In the above example, the variable resistance device should continue to output the "OFF" current ($I_{OFF}$) when the read voltage ($V_{READ}$) is applied to the electrodes for the second time, third time, and so on.

Continuing with the above example, when it is desired to turn "ON" the cell that is currently in the HRS switch, a set operation is performed. This operation may use the same read and write circuitry to apply a set voltage ($V_{SET}$) to the electrodes. Applying the set voltage forms one or more conductive paths in the variable resistance layer as described above with reference to FIGS. 2B and 2C. The switching from the HRS to LRS is indicated by dashed line 306 in FIGS. 3A and 3B. The resistance characteristics of the variable resistance device in its LRS are represented by line 304. When the read voltage ($V_{READ}$) is applied to the electrodes of the cell in this state, the external read and write circuitry will sense the resulting "ON" current ($I_{ON}$) that flows through the variable resistance device. Again, this read operation may be performed multiple times without switching the state of the variable resistance device.

At some point, it may be desirable to turn "OFF" the Variable resistance device by changing its state from the LRS to HRS. This operation is referred to as a reset operation and should be distinguished from set operation during which the variable resistance device is switched from its HRS to LRS. During the reset operation, a reset voltage ($V_{RESET}$) is applied to the variable resistance device to break the previously formed conductive paths in the variable resistance layer.

Switching from a LRS to HRS is indicated by dashed line 308. Detecting the state of the variable resistance device while it is in its HRS is described above.

Overall, the variable resistance device or, more specifically, the variable resistance layer of the variable resistance device may be switched back and forth between its LRS and HRS many times. Read operations may be performed in each of these states (between the switching operations) one or more times or not performed at all. It should be noted that application of set and reset voltages to change resistance states of the variable resistance device involves complex mechanisms that are believed to involve localized resistive heating as well as mobility of defects impacted by both temperature and applied potential.

In some embodiments, the set voltage ($V_{SET}$) is between about 100 mV and 10V or, more specifically, between about 500 mV and 5V. The length of set voltage pulses ($t_{SET}$) may be less than about 100 milliseconds or, more specifically, less than about 5 milliseconds and even less than about 100 nanoseconds. The read voltage ($V_{READ}$) may be between about 0.1 and 0.5 of the write voltage ($V_{SET}$). In some embodiments, the read currents ($I_{ON}$ and $I_{OFF}$) are greater than about 1 mA or, more specifically, is greater than about 5 mA to allow for a fast detection of the state by reasonably small sense amplifiers. The length of read voltage pulse ($t_{READ}$) may be comparable to the length of the corresponding set voltage pulse ($t_{SET}$) or may be shorter than the write voltage pulse ($t_{RESET}$). Variable resistance devices should be able to cycle between LRS and HRS between at least about $10^3$ times or, more specifically, at least about $10^7$ times without failure. A data retention time ($t_{RET}$) should be at least about 5 years or, more specifically, at least about 10 years at a thermal stress up to 85° C. and small electrical stress, such as a constant application of the read voltage ($V_{READ}$). Other considerations may include low current leakage, such as less than about 40 A/cm² measured at 0.5 V per 20 Å of oxide thickness in HRS.

Figure 3C:
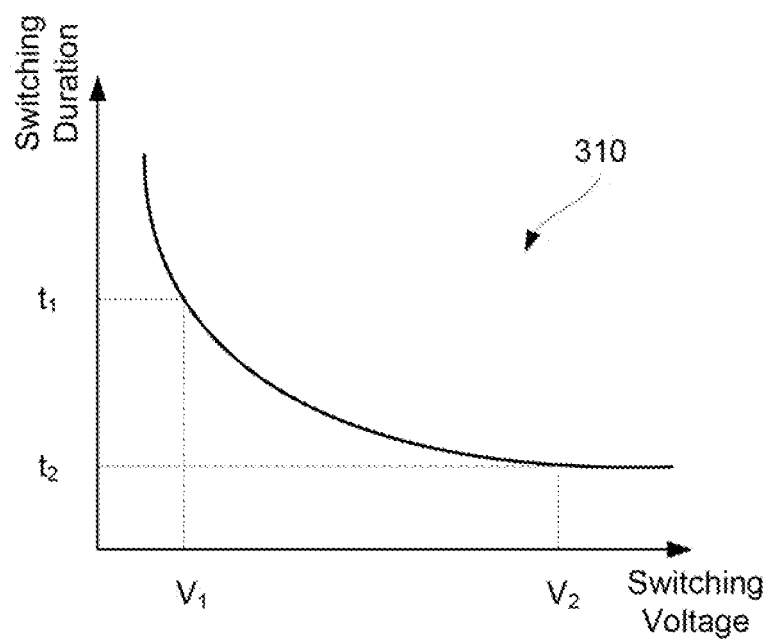
FIG. 3C illustrates one example of a switching duration profile as a function of the switching voltage, in accordance with some embodiments.

The duration of the reset operation (i.e., switching from LRS to HRS) depends on the voltage applied between the two electrodes. In general, a higher voltage results in a faster switching and vice versa. FIG. 3C illustrates one example of a switching duration profile 310 as a function of the switching voltage, in accordance with some embodiments. Two switching points are identified in profile 310 for illustrative reasons. At a lower voltage ($V_1$), it takes longer ($t_1 > t_2$) to switch the cell from LRS to HRS than at a higher voltage ($V_2 < V_1$). As described above, resistive switching involves complex mechanisms that are believed to involve localized resistive heating as well as mobility of defects impacted by both temperature and applied potential. The high voltage will cause more resistive heating and provide a higher driving force for defects thereby resulting in faster switching.

Figure 4A:
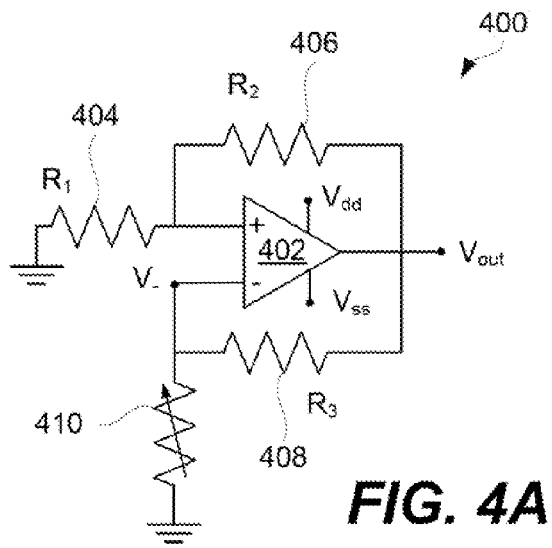
FIG. 4A is an electrical diagram of a voltage controlling assembly, in accordance with some embodiments.

FIG. 4A is an electrical diagram of a voltage controlling assembly 400, in accordance with some embodiments. Voltage controlling assembly 400 includes a comparator 402 having two differential signal nodes, which are identified as (+) and (−) in the figure. Comparator 102 is connected to a DC power supply through nodes $V_{dd}$ and $V_{ss}$, and has an output node $V_{out}$. Voltage controlling assembly 400 also includes a variable resistance device 410. Variable resistance device 410 may include a first conductive layer, a second conductive layer, and a variable resistance layer as described above with reference to FIGS. 2A-2C. The first conductive layer is operable as a first electrode of the variable resistance device and is electrically connected to the first differential signal node (−) of the comparator. The second conductive layer is operable as a second electrode of the variable resistance device and is electrically connected to a reference voltage source, shown as the ground in FIG. 4A. The variable resistance layer is disposed between the first conductive layer and the second conductive layer and is configured to switch between a first resistive state and a second resistive state as described above with reference to FIGS. 2A-2C. The resistance of the variable resistance device in the first resistive state may be less than the resistance of the variable resistance device in the second resistive state. Variable resistance device 410 may be a bipolar variable resistance device. In some embodiments, variable resistance device 410 is configured to switch from the first resistive state to the second resistive state when a potential of the first conductive layer is greater than a potential of the second conductive layer. Voltage controlling assembly 400 also includes three resistors 404, 406, and 408.

Figure 4B:
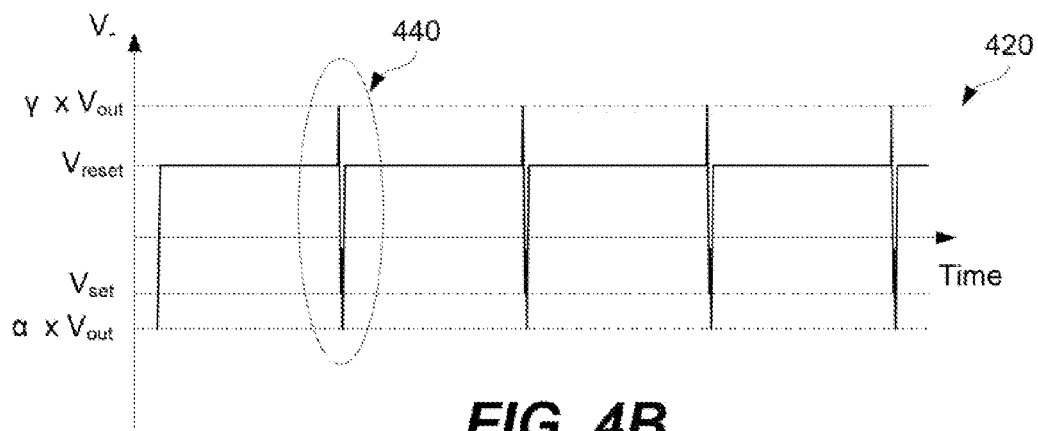
FIG. 4B illustrates a voltage profile at one of differential signal nodes of the comparator of the voltage controlling assembly (shown in FIG. 4A), in accordance with some embodiments.
Figure 4C:
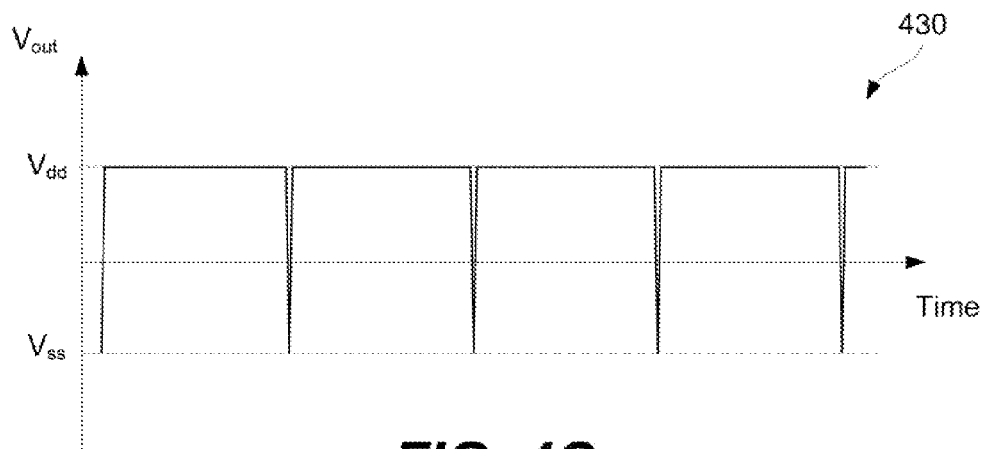
FIG. 4C illustrates a voltage profile at an output of the voltage controlling assembly (shown in FIG. 4A) as a function of time and corresponding to the voltage profile at one of differential signal nodes (shown in FIG. 4B), in accordance with some embodiments.

The frequency output of voltage controlling assembly 400 may be determined by a delay in switching from the first resistive state to the second resistive state when a switching voltage is applied by comparator 402 between the first conductive layer and the second conductive layer of variable resistance device 410 as will now be described with reference to FIGS. 4B-4D. Specifically, FIG. 4B illustrates a voltage profile 420 at one of the differential signal nodes (i.e., V− node) as a function of time, while FIG. 4C illustrates a corresponding voltage profile 430 at the output (i.e., $V_{out}$ node) as a function of time. In this example, voltage controlling assembly 400 operates effectively as a clock having voltage spikes at a constant frequency. As shown in FIG. 4B, the reset voltage is applied to variable resistance device 410 most of the time during operation. This reset voltage is selected in such a way that the actual switching from LRS to HRS happens after a certain time. The switch from HRS to LRS may be performed very quickly, e.g., within several picoseconds. The switching and meeting comparator's conditions can be better explained with reference to FIG. 4D, which is an expanded view of portion 440 of voltage profile 420.

Figure 4D:
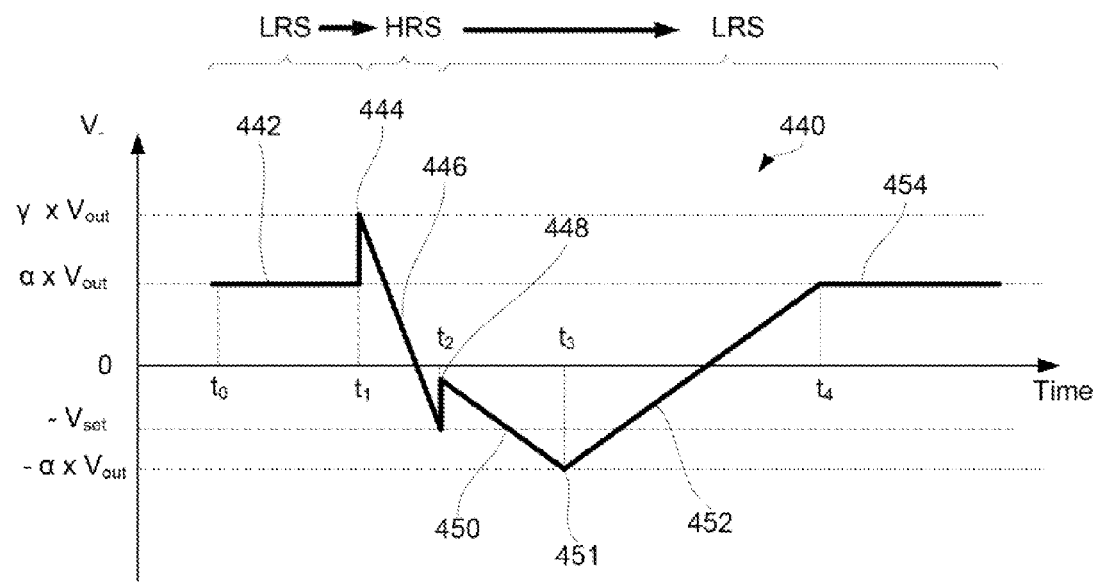
FIG. 4D is an expanded view of a portion of the voltage profile (shown in FIG. 4B) that includes switching of the variable resistance device, in accordance with some embodiments.

As shown in FIG. 4D, the voltage at the differential node (V−) may be initially (at time $t_0$) $\alpha \times V_{out}$, illustrated by line 442, where $\alpha = R_{LRS}/(R_{LRS}+R_3)$, since at this point, variable resistance device 410 is at its LRS. After a predetermined delay (at $t_1$), variable resistance device 410 switches from LRS to HRS. As described above, the switching results from a voltage being applied across variable resistance device 410 causing resistive heating and providing charge driving potential. During this switch, the voltage at the differential node (V−) rapidly increases because of the rapid change in resistance. The voltage rapidly rises to $\gamma \times V_{out}$, shown as point 444, where $\gamma = R_{HRS}/(R_{HRS}+R_3)$. At that point, comparator 402 switches its polarity, causing the decline in voltage shown by line 446. The steepness of the voltage increases and declines is determined by the resistance state of variable resistance device 410. Since the variable resistance device is at HRS after triggering comparator at $t_1$, line 446 is relatively steep. At some point ($t_2$), the voltage reaches the $-V_{set}$ level and variable resistance device 410 may switch from its HRS to LRS. This switching event causes a drop in the absolute value of the applied voltage because the resistance of variable resistance device 410 goes up. However, since the switch appears while the voltage is negative (i.e., below the zero line), the actual voltage becomes more positive, as shown by point 448. After this switching event, the voltage continues to decline as shown by line 450, but because variable resistance device 410 is now in its LRS the slope of this line is less than, for example, the slope of line 446. The voltage continues to decrease until it reaches the $-\alpha \times V_{out}$ level (at $t_3$) as shown by point 451. At this point, comparator 402 switches its polarity again. After $t_3$, the voltage increases as shown by line 452. The absolute value of the slope of line 452 may be substantially the same as that of line 450 as variable resistance device 410 remains in its LRS. Once the voltage reaches α×V$_{out}$, the transition is complete and the voltage may stay constant as shown by line 454 until variable resistance device 410 switches from LRS to HRS, as described above, again.

Figure 5A:
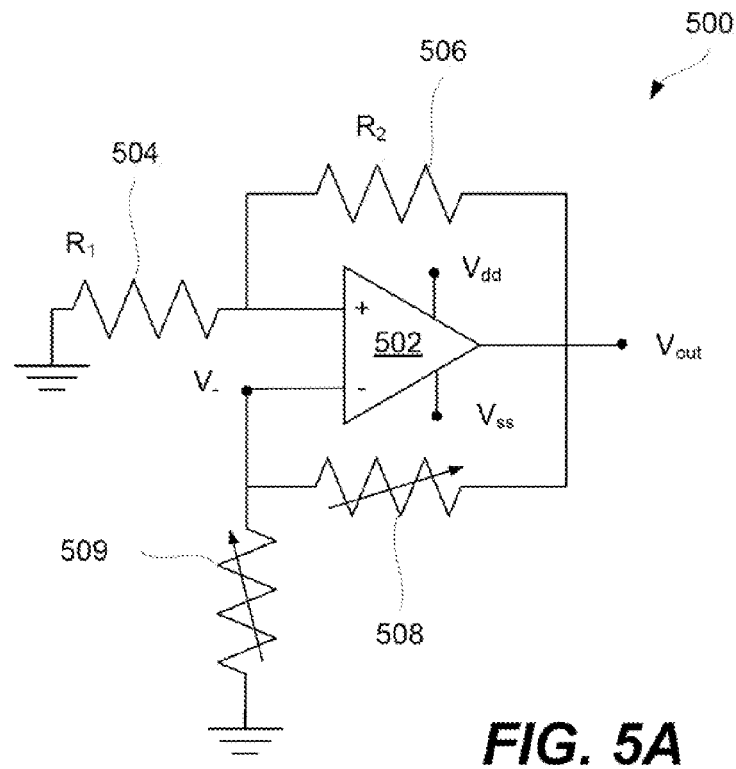
FIGS. 5A-5F are electrical diagrams of different voltage controlling assemblies including variable resistance devices, in accordance with some embodiments.

FIG. 5A is an electrical diagram of another voltage controlling assembly 500 that includes two variable resistance devices 508 and 509, in accordance with some embodiments. Both variable resistance devices 508 and 509 are connected to the same differential node of comparator 502. However, variable resistance device 508 is also connected to the output of comparator 502, while variable resistance device 509 is connected to the reference voltage (e.g., ground). Voltage controlling assembly 500 also includes two resistors 504 and 506 connected to another differential node of comparator 502. Resistor 504 is also connected to the reference voltage (e.g., ground), while resistor 504 is also connected to the output of comparator 502.

Figure 5B:
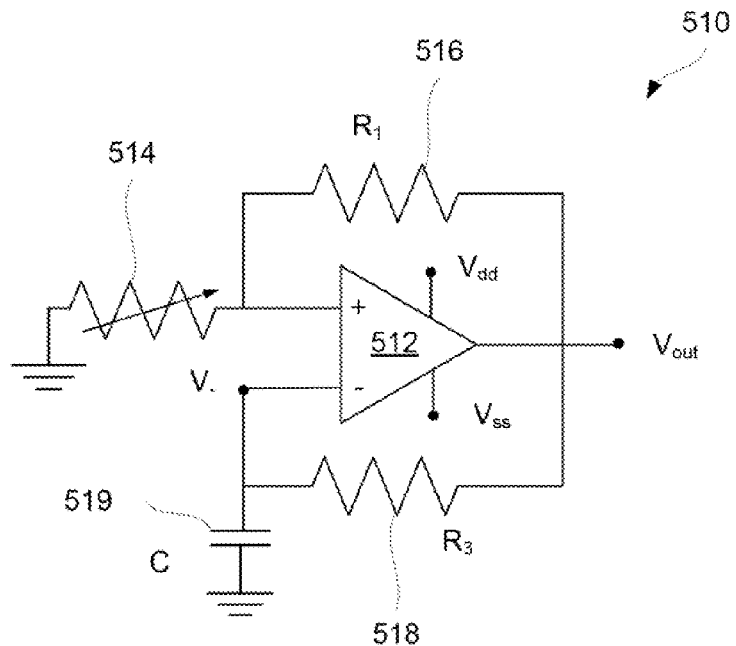

FIG. 5B is an electrical diagram of another voltage controlling assembly 510 that includes both a variable resistance device 514 and a capacitor 519, in accordance with some embodiments. Variable resistance device 514 is connected to one differential node of comparator 512, while capacitor 519 is connected to another one. Variable resistance device 514 is also connected to the reference voltage (e.g., ground). Likewise, capacitor 519 is also connected to the reference voltage. Voltage controlling assembly 510 also includes two resistors 516 and 518, both connected to the output of comparator 512. Resistor 516 is also connected to the differential node of comparator 512 to which variable resistance device 514 is connected, while resistor 516 is also connected to the differential node of comparator 512 to which capacitor 519 is connected.

Figure 5C:
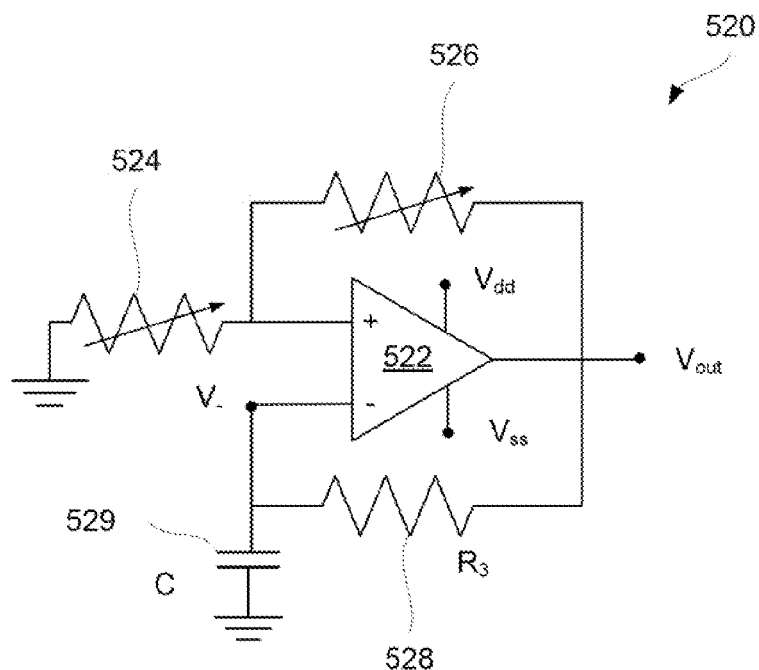

FIG. 5C is an electrical diagram of another voltage controlling assembly 520 that includes two variable resistance devices 524 and 526 and capacitor 529, in accordance with some embodiments. Both variable resistance devices 524 and 526 are connected to one differential node of comparator 522, while capacitor 529 is connected to another one. Variable resistance device 524 is also connected to the reference voltage (e.g., ground), while variable resistance device 526 is also connected to the output of comparator 522. Capacitor 529 is also connected to the reference voltage. Voltage controlling assembly 520 also a resistor 528 connected to the output of comparator 522 as well as to differential node of comparator 522 to which capacitor 529 is connected.

Figure 5D:
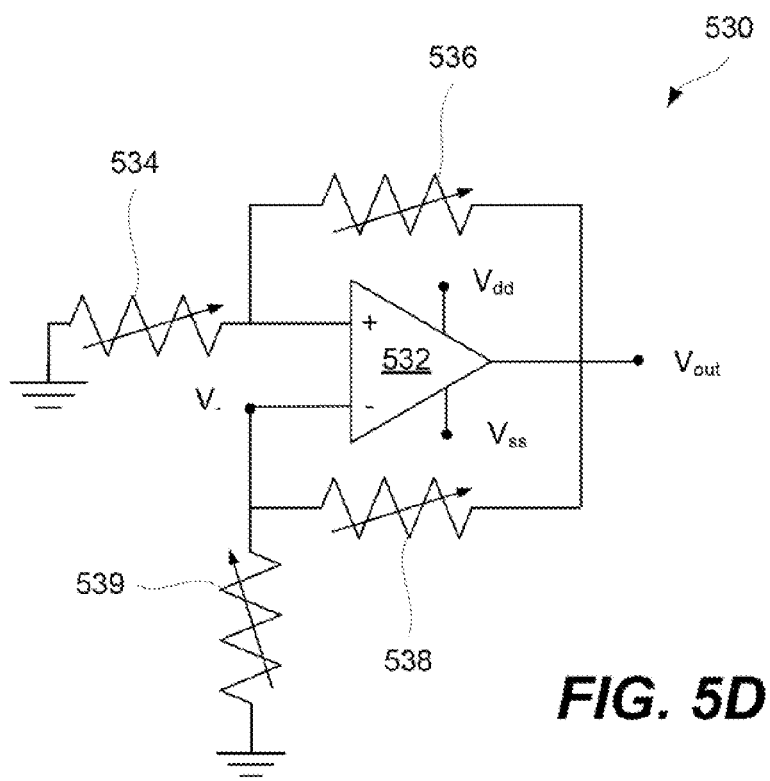

FIG. 5D is an electrical diagram of yet another voltage controlling assembly 530 that includes four variable resistance devices 534, 536, 538, and 539, in accordance with some embodiments. Variable resistance devices 534 and 536 are connected to one differential node of comparator 532, while variable resistance devices 538 and 539 are connected to another one. Variable resistance device 534 is also connected to the reference voltage (e.g., ground), while variable resistance device 536 is also connected to the output of comparator 532. Variable resistance device 539 is also connected to the reference voltage, while variable resistance device 538 is also connected to the output of comparator 532.

Figure 5E:
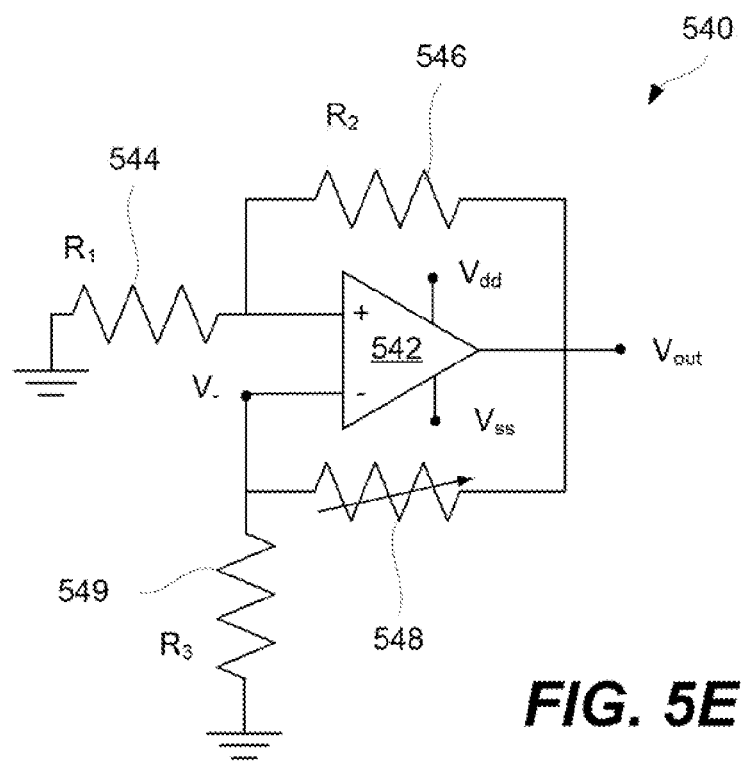

FIG. 5E is an electrical diagram of another voltage controlling assembly 540 that includes a variable resistance device 548, in accordance with some embodiments. Variable resistance device 548 is connected to one differential node of comparator 542 and an output node. Voltage controlling assembly 540 also includes three resistors 544, 546, and 549. Specifically, resistor 549 is connected to the same differential node of comparator 542 to which variable resistance device 548 is connected. Resistor 549 is connected is also connected to the reference voltage. Resistor 546 is connected between the other differential node of comparator 542 and to the output node, while resistor 544 is connected to this other differential node of comparator 542 and to the reference voltage.

Figure 5F:
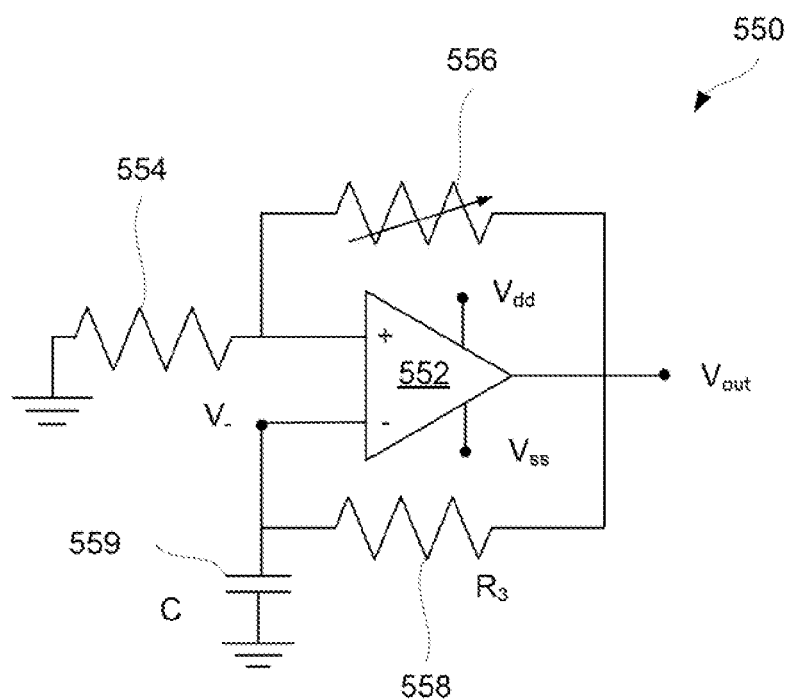

FIG. 5F is an electrical diagram of another voltage controlling assembly 550 that includes a variable resistance device 556 and a capacitor 559, in accordance with some embodiments. Variable resistance device 556 is connected to one differential node of comparator 552 (and to the output node), while capacitor 559 is connected to the other differential node of comparator 552 (and to the reference voltage). Voltage controlling assembly 550 also includes two resistors 554 and 558. Resistor 554 is connected to the same differential node of comparator 552 to which variable resistance device 556 is connected. Resistor 554 is also connected to the reference voltage. Resistor 558 is connected to the same differential node of comparator 552 to which capacitor 559 is connected to. Resistor 558 is also connected to the output node of comparator 552.

When a capacitor is a part of the voltage controlling assembly as, e.g., shown in FIGS. 5B, 5C, and 5F, the capacitor may be responsible to trigger the comparator as will now be described with reference to FIGS. 6A-6D. Specifically, FIGS. 6A-6D refer to a circuit shown in FIG. 5B, in which a voltage dividing circuit connected to the (+) differential node of comparator 512 includes variable resistance device 514 and resistor 516. Variable resistance device 514 has two resistance states, i.e., R$_{HRS}$ and R$_{LRS}$, while resistor 516 has a constant resistance, i.e., R$_1$. As such, the coefficient α is defined as α=R$_{LRS}$(R$_{LRS}$+R$_1$), while coefficient β is defined as β=R$_{HRS}$/(R$_{HRS}$+R$_1$). Voltage dividing circuit connected to the (−) differential node of comparator 512 includes resistor 518 and capacitor 519.

Figure 6A:
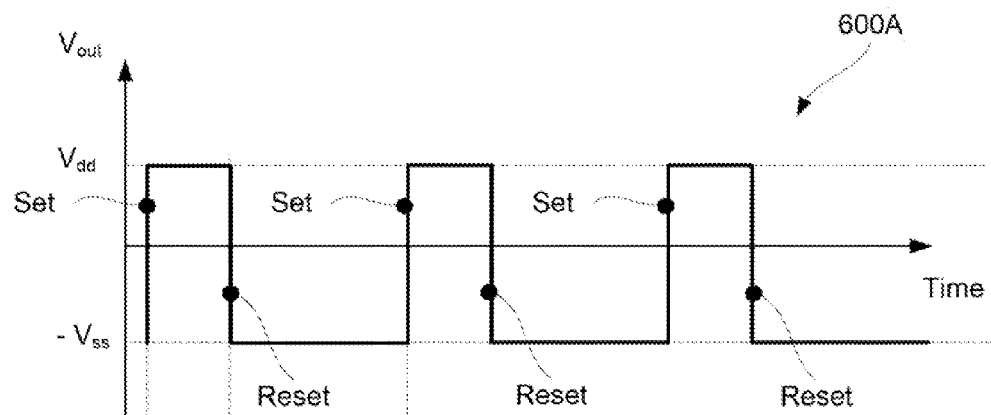
FIG. 6A illustrates a voltage profile at output nodes of a voltage controlling assembly, in accordance with some embodiments.
Figure 6B:
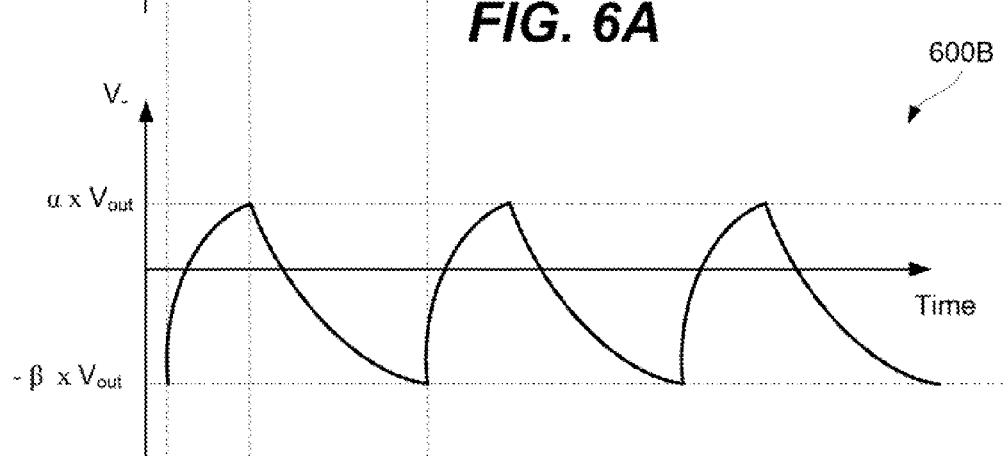
FIG. 6B illustrates a voltage profile at one of differential signal nodes of the comparator of the voltage controlling assembly corresponding to the voltage profile shown in FIG. 6A, in accordance with some embodiments.
Figure 6C:
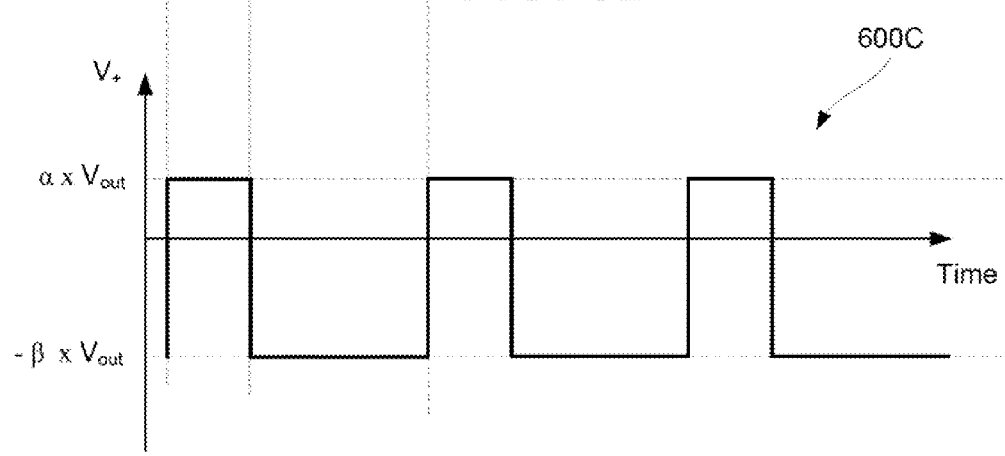
FIG. 6C illustrates a voltage profile at another differential signal node of the comparator of the voltage controlling assembly corresponding to the voltage profile shown in FIG. 6A, in accordance with some embodiments.

FIG. 6A illustrates a voltage profile 600A at output nodes of voltage controlling assembly 510, in accordance with some embodiments. The set and reset points of variable resistance device 514 are indicated at each cycle. Because the resistance of variable resistance device 514 is lower after the set operation and higher after the reset operation, the output voltage remains at V$_{dd}$ for a shorter time than it remains at −V$_{ss}$. The reason for this difference in duration can be seen from FIG. 6B, which illustrates a voltage profile 600B at the differential signal node (V) of comparator 512 corresponding to voltage profile 600A shown in FIG. 6A, in accordance with some embodiments. Specifically, because R$_{HRS}$ is greater than R$_{LRS}$, the β coefficient is also greater α. As described above, these coefficients are determined by the resistances of variable resistance device 514 and resistor 516. Consequentially, triggering conditions for comparator 512 will be different, i.e., β×V$_{out}$ and α×V$_{out}$ with β×V$_{out}$>α×V$_{out}$. These conditions are shown as dotted lines in FIGS. 6B and 6C. Specifically, in FIG. 6B, the charging of the capacitor is cut earlier (after passing the zero voltage level) than the discharge (again, after passing the zero voltage level). These different cut-off conditions result in different lengths of the cycles during charge and the discharge and, consequently, the output voltage remaining for shorter period of time at V$_{dd}$ level than at −V$_{ss}$ level. A voltage profile 600C at another differential signal node (V$_+$) of comparator 512 is shown in FIG. 6C.

Figure 6D:
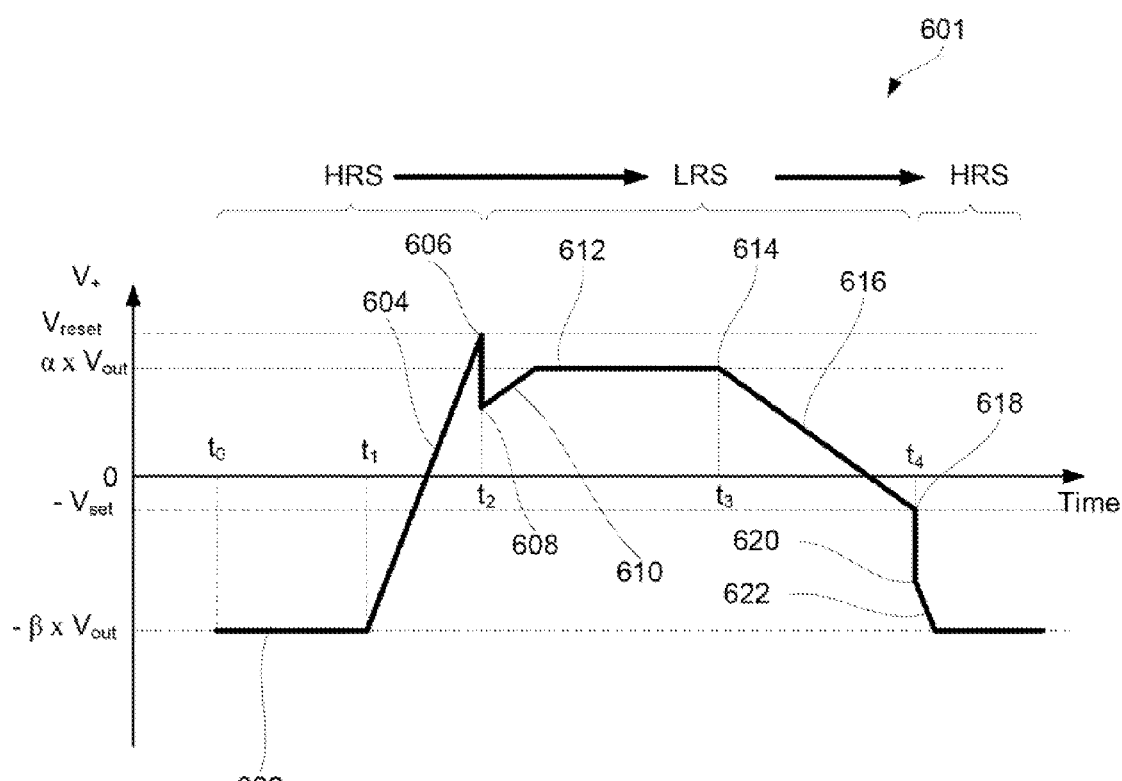
FIG. 6D is an expanded view of a portion of the voltage profile (shown in FIG. 6C) that includes switching of the variable resistance device, in accordance with some embodiments.

FIG. 6D is an expanded view of a portion 601 of voltage profile 600C (shown in FIG. 6C) that includes switching of variable resistance device 514, in accordance with some embodiments. The voltage at the differential node (V$_+$) may be initially (at time t$_0$) kept at the −β×V$_{out}$ level, which is illustrated by line 602. At this point, variable resistance device 514 is at its HRS. At some point in time (at t$_1$), capacitor 519 charges to the threshold corresponding to a triggering point of comparator 512, and comparator 512 may start changing its connections between power nodes and differential signal nodes (i.e., "switching" of comparator 512) resulting in a voltage increase as shown by line 604. When the voltage reaches the set voltage ($V_{set}$) of variable resistance device 514 at time $t_2$, variable resistance device 514 switches from its HRS to its LRS, causing the voltage to drop from point 606 to point 608. Afterward, the voltage may continue to climb to $\alpha \times V_{out}$. The voltage may stay at this level (as shown by line 612) until capacitor 519 may trigger the comparator again at $t_3$. At that point, the voltage may decline to as indicated by line 616 until it reaches another resistive switching point at $t_4$. The absolute value of the slope of line 616 is the same as that of line 610, both corresponding to the LRS. At $t_4$, variable resistance device 514 switches from its LRS to HRS and the magnitude of the voltage rapidly increases from point 618 and 620. The voltage continues to decrease (as shown by line 622) until reaching the $-\beta \times V_{out}$ level and the process may be repeated.

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A voltage controlling assembly comprising:
    a comparator having a first differential signal node and a second differential signal node; and
    a variable resistance device comprising a first conductive layer, a second conductive layer, and a variable resistance layer,
        wherein the first conductive layer is operable as a first electrode of the variable resistance device and is electrically connected to the first differential signal node of the comparator,
        wherein the second conductive layer is operable as a second electrode of the variable resistance device and is electrically connected to a reference voltage source,
        wherein the variable resistance device is disposed between the first conductive layer and the second conductive layer and is configured to switch between a first resistive state and a second resistive state, and
        wherein a resistance of the variable resistance device in the first resistive state is less than a resistance of the variable resistance device in the second resistive state.

2. The voltage controlling assembly of claim 1, wherein the variable resistance device is a bipolar variable resistance device.

3. The voltage controlling assembly of claim 2, wherein the variable resistance device is configured to switch from the first resistive state to the second resistive state when a potential of the first conductive layer is greater than a potential of the second conductive layer.

4. The voltage controlling assembly of claim 1, wherein a frequency output of the voltage controlling assembly is determined by a delay in switching from the first resistive state to the second resistive state when a switching voltage is applied by the comparator between the first conductive layer and the second conductive layer.

5. The voltage controlling assembly of claim 1, further comprising a first constant resistor and a second constant resistor connected to the second differential signal node of the comparator.

6. The voltage controlling assembly of claim 5, further comprising a third constant resistor connected to the first differential signal node of the comparator.

7. The voltage controlling assembly of claim 5, further comprising an additional variable resistance device connected to the first differential signal node of the comparator.

8. The voltage controlling assembly of claim 1, further comprising a capacitor connected to the second differential signal node of the comparator.

9. The voltage controlling assembly of claim 8, further comprising an additional variable resistance device connected to the first differential signal node of the comparator.

10. The voltage controlling assembly of claim 1, further comprising an additional variable resistance device connected to the first differential signal node of the comparator.

11. The voltage controlling assembly of claim 10, further comprising two more additional variable resistance devices connected to the second differential signal node of the comparator.

12. The voltage controlling assembly of claim 1, wherein the variable resistance layer comprises one of a phase change chalcogenide, a transition metal oxide, a perovskite, a solid electrolyte, an organic charge transfer complex, or an organic donor-acceptor system.

13. The voltage controlling assembly of claim 1, wherein the variable resistance layer comprises a transition metal oxide.

14. The voltage controlling assembly of claim 13, wherein the transition metal oxide of the variable resistance layer is a non-stoichiometric transition metal oxide.

15. The voltage controlling assembly of claim 1, wherein the variable resistance layer comprises one of hafnium oxide, zirconium oxide, aluminum oxide, titanium oxide, tantalum oxide, or silicon oxide.

16. The voltage controlling assembly of claim 1, wherein the variable resistance layer comprises a phase change chalcogenide.

17. The voltage controlling assembly of claim 1, wherein the voltage controlling assembly is operable as a clock having voltage spikes at a constant frequency.

18. The voltage controlling assembly of claim 1, wherein the voltage controlling assembly is operable as an oscillator.

19. The voltage controlling assembly of claim 18, wherein the oscillator is configured to produce different durations for a negative voltage output and a positive voltage output.

20. The voltage controlling assembly of claim 1, wherein the reference voltage source is ground.

* * * * *